United States Patent

Kowshik

[11] Patent Number: 5,576,568
[45] Date of Patent: Nov. 19, 1996

[54] SINGLE-TRANSISTOR ELECTRICALLY-ALTERABLE SWITCH EMPLOYING FOWLER NORDHEIM TUNNELING FOR PROGRAM AND ERASE

[75] Inventor: Vikram Kowshik, Fremont, Calif.

[73] Assignee: Actel Corporation, Sunnyvale, Calif.

[21] Appl. No.: 374,494

[22] Filed: Jan. 18, 1995

[51] Int. Cl.⁶ .................................................. H01L 29/788
[52] U.S. Cl. ........................ 257/318; 257/321; 365/185.1
[58] Field of Search ................................. 257/318, 321; 365/185

[56]  References Cited

U.S. PATENT DOCUMENTS

| | | | |
|---|---|---|---|
| 4,375,086 | 2/1983 | van Velthoven | 365/149 |
| 4,495,427 | 1/1985 | Cartwright | 307/469 |
| 4,617,479 | 10/1986 | Hartmann et al. | 307/465 |
| 4,622,656 | 11/1986 | Kamiya et al. | 365/185 |
| 4,742,492 | 5/1988 | Smayling et al. | 365/218 |
| 4,822,753 | 4/1989 | Pintchovski et al. | 437/192 |
| 4,851,361 | 7/1989 | Schumann et al. | 437/30 |
| 4,878,199 | 10/1989 | Mizutani | 365/185 |
| 4,924,278 | 5/1990 | Logie | 257/321 |
| 5,247,478 | 9/1993 | Guota et al. | 365/185 |

*Primary Examiner*—Mark V. Prenty
*Attorney, Agent, or Firm*—D'Alessandro & Ritchie

[57]  ABSTRACT

A one-transistor, electrically-alterable switch in combination with a pass transistor includes a first MOS transistor having a drain, a gate, and a source, and a pass transistor having a drain, a source and a floating gate. The floating gate is capacitively coupled to the source of the first MOS transistor through a tunneling dielectric. An erase electrode is capacitively coupled to the floating gate through a coupling dielectric.

3 Claims, 3 Drawing Sheets

SINGLE-TRANSISTOR ELECTRICALLY-ALTERABLE SWITCH EMPLOYING FOWLER NORDHEIM TUNNELING FOR PROGRAM AND ERASE

BACKGROUND OF THE INVENTION

1. Field of the Invention

The present invention relates to electronic switches. More particularly, the present invention relates to a single transistor electrically-alterable switch employing Fowler-Nordheim tunneling for programming and erase.

2. The Prior Art

The problem of providing non-volatile switching elements has been addressed in the prior art. Several solutions have been proposed. With the exception of using a non-volatile (e.g., EPROM or EEPROM) transistor itself as a switching element, see U.S. Pat. No. 5,015,885 to El Gamal et al., all of the prior art solutions to the problem of providing a non-volatile switch element require the use of a relatively large number of devices.

U.S. Pat. No. 4,132,904 to Harrari, discloses a static-RAM-like structure employing a cross-coupled CMOS latch in which the N-Channel transistors are provided with floating gates which may be programmed to impart a desired state to the latch. While the Harrari circuit does provide a non-volatile latch which provides complementary data which can be reprogrammed, it requires high-voltage n-well structures and provides indeterminate data on first powerup. In addition, the floating gate structures are prone to the well known read-disturb phenomenon by which repeated read operations can degrade the stored data.

U.S. Pat. No. 4,300,212 to Simko discloses a non-volatile static RAM circuit. It employs a very large cell size including at least eight transistor devices, some of which are complicated semiconductor structures.

U.S. Pat. No. 4,858,185 to Kowshik et al. discloses a structure employing a CMOS non-volatile latch. While the Kowshik et al. latch does provide a non-volatile latch which provides complementary data which can be reprogrammed, can assume a known state on powerup and does not require high-voltage n-well technology, it requires a very large cell size employing ten transistors as well as other structures.

It is therefore an object of the present invention to provide a non-volatile switching element which overcomes some of the shortcomings of the prior art.

Another object of the present invention is to provide a non-volatile switching element which employs a small cell size.

Another object of the present invention is to provide a non-volatile switching element which employs a minimum number of transistor devices.

A further object of the present invention is to provide a non-volatile switching element which does not require high-voltage n-well technology.

Yet another object of the present invention is to provide a non-volatile switching element which has improved read-disturb immunity.

It is a further object of the present invention to provide a non-volatile switching element which assumes a known state on powerup after initial programming.

BRIEF DESCRIPTION OF THE INVENTION

A one-transistor, electrically-alterable switch of the present invention may be used in combination with a pass transistor. The one-transistor, electrically-alterable switch includes a first MOS transistor having a drain, a gate, and a source. The pass transistor includes a drain, a source and a floating gate. The floating gate is capacitively coupled to the source of the first MOS transistor through a tunneling dielectric forming a tunneling capacitor. An erase electrode is capacitively coupled to the floating gate through a coupling dielectric forming a coupling capacitor. The coupling capacitor is larger than the tunneling capacitor in order to allow the voltage on the floating gate to follow the voltage on the erase electrode.

The one-transistor, electrically-alterable switch of the present invention may be erased (the floating gate charge made negative) by taking both the gate and the erase electrode to a high voltage and grounding the drain of the transistor. This operation causes an electric field to exist across the tunneling capacitor of sufficient magnitude to cause electrons to tunnel onto the floating gate, imparting to it a negative charge. Since the gate of any pass transistor connected to the one-transistor switch is electrically connected to the floating gate, it will be turned off.

To program the one-transistor electrically alterable switch, its gate and drain are taken to a high voltage, and the erase electrode is grounded. This operation causes an electric field of opposite polarity to the electric field created during the erase operation to exist across the tunneling capacitor of sufficient magnitude to cause electrons to tunnel off of the floating gate, imparting to it a positive charge. Since the gate of any pass transistor connected to the one-transistor switch is electrically connected to the floating gate, it will be turned on.

The one-transistor, electrically-alterable switch can be so designed that with the proper programming voltages on its gate, drain, and erase electrode enough electrons are removed from the floating gate that the threshold voltage of the pass transistor becomes sufficiently negative so that it can transmit full logic levels without incurring threshold drop across itself. This eliminates the need for pumping techniques to be used to avoid the threshold drop across the pass transistor as is commonly done with SRAM-based switches.

The one-transistor switch may be fabricated using a single level polysilicon gate CMOS process. Spaced-apart high-voltage source and drain regions are disposed in a semiconductor substrate. A polysilicon line, which may be used as a row line common to all one-transistor switches in an array of such switches, lies above the channel region defined between the source and the drain of the transistor and forms the gate of the transistor. A separate polysilicon region formed from the same layer of polysilicon as the gate of the transistor is used to form a floating gate. A portion of the floating gate lies above the source of the transistor and is coupled to the source of the transistor through a tunnel dielectric forming a tunneling capacitor.

A separate high voltage diffusion in the substrate also underlies the floating gate and forms the erase electrode. The erase electrode is separated from the floating gate by a coupling dielectric forming a coupling capacitor. The coupling capacitor is larger than the tunneling capacitor in order to allow the voltage on the floating gate to follow the voltage on the floating gate.

An array of one-transistor electrically-alterable switches according to the present invention may be formed in a semiconductor substrate. The one transistor switches are arranged in rows and columns. The polysilicon gates of the transistors in each row may be formed from a single polysilicon strip. A metal line may be used to connect together all of the drains of the transistors in each column of the array. The erase electrodes for all of the switches in the array may be formed from a single diffused region in the substrate.

Programming circuitry is disposed on the integrated circuit to selectively supply a programming voltage or ground to the gate strips, the metal column lines, and the erase electrode to program and erase the switches.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
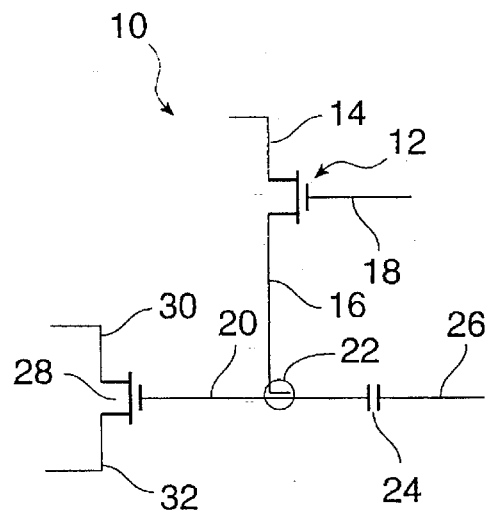
FIG. 1 is a schematic diagram of the one-transistor, electrically-alterable switch of the present invention.

Referring first to FIG. 1, a schematic diagram illustrates the one-transistor electrically alterable switch 10 of the present invention. A first MOS transistor 12 has a drain 14, a source 16, and a gate 18. The source 16 is capacitively coupled to a floating gate 20 via a tunneling capacitor 22. A coupling capacitor 24 capacitively couples floating gate 20 to an erase electrode 26. Coupling capacitor 24 is larger than tunneling capacitor 22 in order that the voltage on the floating gate 20 be allowed to follow the voltage on erase electrode 26. In a typical embodiment of the present invention, tunneling capacitor 22 will be equal to the minimum area printable by the photolithography equipment used in the fabrication process and coupling capacitor 24 will be equal to ten to forty times the area of the tunneling capacitor 22.

An N-Channel MOS pass transistor 28 uses floating gate 20 as its gate. Its drain 30 and source 32 may be used to connect together any desired circuit node by programming the one-transistor electrically-alterable switch 10. As will be appreciated by those of ordinary skill in the art, floating gate 20 may be equipped with an extending finger to act as the gate of pass transistor 28, or may be connected to a separate gate by a metal line as is known in the art.

The one-transistor electrically-alterable switch 10 of the present invention is both programmed (the floating gate 20 charged positive) and erased (the floating gate 20 charged negative) by Fowler-Nordheim tunneling. In order to erase the one-transistor electrically-alterable switch 10, the gate 18 and erase electrode 26 are taken to a programming voltage Vpp, which may be in the range of from about 10 volts to about 15 volts. The drain 14 of transistor 12 is held at ground. This operation causes an electric field to exist across first tunneling capacitor 22 of sufficient magnitude to cause electrons to tunnel onto floating gate 20, thus imparting a negative charge to it. This has the effect of turning off N-Channel enhancement pass transistor 28.

In order to program the one-transistor electrically-alterable switch 10, the gate 18 of transistor 12 is taken to the programming voltage Vpp. The erase electrode 26 is held at ground. The drain 14 of transistor 12 is also taken to Vpp. This operation causes an electric field opposite in sign to the electric field used to erase the one-transistor, electrically-alterable switch 10 to exist across tunneling capacitor 22. The field is of sufficient magnitude to cause electrons to tunnel off of floating gate 20, thus imparting a positive charge to it. This has the effect of turning on N-Channel enhancement pass transistor 28.

Figure 2:
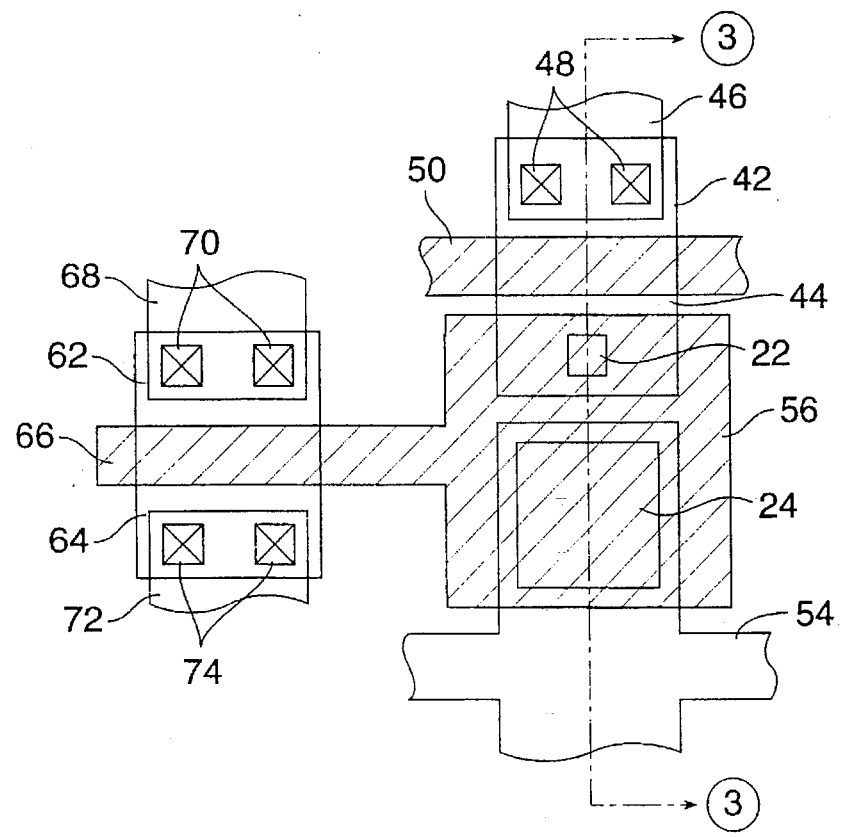
FIG. 2 is a top view of a presently preferred semiconductor layout of the one-transistor, electrically-alterable switch of FIG. 1.
Figure 3:
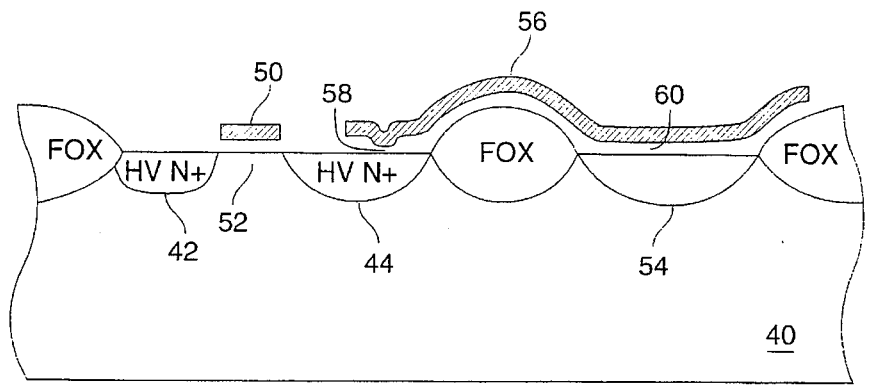
FIG. 3 is a cross-sectional view of the semiconductor layout of the one-transistor, electrically-alterable switch of FIG. 2, taken through lines 3—3.

Referring now to FIGS. 2 and 3, a presently-preferred layout of the one-transistor, electrically-alterable switch of the present invention will be shown. FIG. 2 is a top view of a presently preferred semiconductor layout of the one-transistor, electrically-alterable switch 10 of FIG. 1 and FIG. 3 is a cross-sectional view of the semiconductor layout of the one-transistor, electrically-alterable switch of FIG. 2, taken through lines 3—3. In the following discussion, the reference numerals of the circuit elements identified in FIG. 1 will be referred to but the physical implementations of them in FIGS. 2 and 3 will be given their own reference numerals.

As shown, but not discussed, in the figures, conventional field oxide and related structures are used to isolated the elements of the circuit from one another as will be appreciated by those of ordinary skill in the art. As is most clearly seen from an examination of FIG. 3, the one-transistor, electrically-alterable switch 10 of the present invention is fabricated on a semiconductor substrate 40. The MOS transistor 12 is formed in the semiconductor substrate 40 with high-voltage diffused region 42 serving as its drain 14 and high-voltage diffused region 44 serving as its source 16. A portion of a metal line 46 is shown connected to drain diffusion 42 by contacts 48 in the top view of FIG. 2. A first piece of polysilicon 50 forms the gate 18 of transistor 12 and is disposed above a channel region 52 of transistor 12.

Erase electrode 26 is formed from an additional high-voltage diffused region 54 in semiconductor substrate 40. Floating gate 20 is formed from a second piece of polysilicon 56 and extends over erase electrode 54 and source diffusion 44 of the transistor 12. A tunnel dielectric 58 separates floating gate polysilicon 56 from the surface of source diffusion 44 to form the tunneling capacitor 22. As will be appreciated by those of ordinary skill in the art, tunnel dielectric 58 is thinner than the surrounding oxide otherwise separating floating gate polysilicon 56 from source diffusion 44. In a presently contemplated embodiment of the present invention where the gate oxide thickness is in the range of about 250 angstroms, tunnel dielectric layer 58 will be in the range of about 50 to about 130 angstroms.

A coupling dielectric 60 separates floating gate polysilicon 56 from erase electrode diffusion 54 and forms coupling capacitor 24. Those of ordinary skill in the art will recognize that the coupling capacitor 24 is larger than tunneling capacitor 22. In a presently contemplated embodiment of the present invention, the area of coupling capacitor 24 may be about 20 square microns and the area of tunneling capacitor 22 may be about 0.64 square microns. The ratio of the areas of the two capacitors will be about 10:1 to 40:1. The purpose of making coupling capacitor 24 larger than tunneling capacitor 22 is to provide enough capacitive coupling so that the floating gate 20 voltage will follow the voltage placed on erase electrode 26.

As may be seen from FIG. 2, the pass transistor 28 is formed from a pair of diffused regions 62 and 64 which form its source 32 and drain 30. An extending finger 66 of polysilicon 56 forms the gate of the pass transistor 28. Source region 62 is connected to metal line 68 through contacts 70 and drain region 64 is connected to metal line 72 through contacts 74.

As may be seen from an examination of FIGS. 2 and 3, the one-transistor electrically-alterable switch 10 of the present invention may be fabricated as a part of a conventional single-level polysilicon gate CMOS integrated circuit fabrication process. Such a process begins with the conventional steps for forming the n-wells (for peripheral devices in the CMOS process), the field implant and field oxidation steps.

The buried n+ mask and implant is then performed in areas overlapping the tunneling capacitor 22 and coupling capacitor 24. Alternatively, the tunneling capacitor 22 can also be formed in the n-type source/drain diffusions using known high-voltage techniques.

Next, a tunnel window is etched to expose the high-voltage n-type diffusion region 44 comprising the source 16 of transistor 12 and the tunnel dielectric 58 is formed, preferably from high quality oxide, and is then defined in the tunnel window. The polysilicon layer which will comprise the gate region 50 of transistor 12 and the floating gate region 56 is then formed, doped and defined, using conventional semiconductor processing technology.

The gate oxide step for the formation of other P-Channel and N-Channel transistor devices on the integrated circuit is then performed. An implant oxide is formed, followed by the masking and implant steps necessary to form both the P-Channel and N-Channel self-aligned high-voltage source and drain regions.

Next, BPSG deposition, contact window formation, and first level metal steps are performed using conventional semiconductor processing techniques. Subsequent metal layers and other back-end processing may then be performed as is well known in the art.

The details of the individual process steps used in the fabrication of the one-transistor, electrically-alterable switch, such as times, temperatures, doses, thicknesses, etc., are well known in the art for formation of CMOS devices and have therefore not been recited herein. As will be recognized by persons of ordinary skill in the art, the process described herein for the fabrication of the one-transistor, electrically-alterable switch of the present invention may be practiced using standard CMOS processing steps, and employing conventional layer thicknesses, implant dosages, etc. The additional processing steps used to form the floating gate, tunnel dielectric, and capacitors are well known in the EEPROM and EEPROM art and are not repeated here in order to avoid overcomplicating the disclosure.

Figure 4:
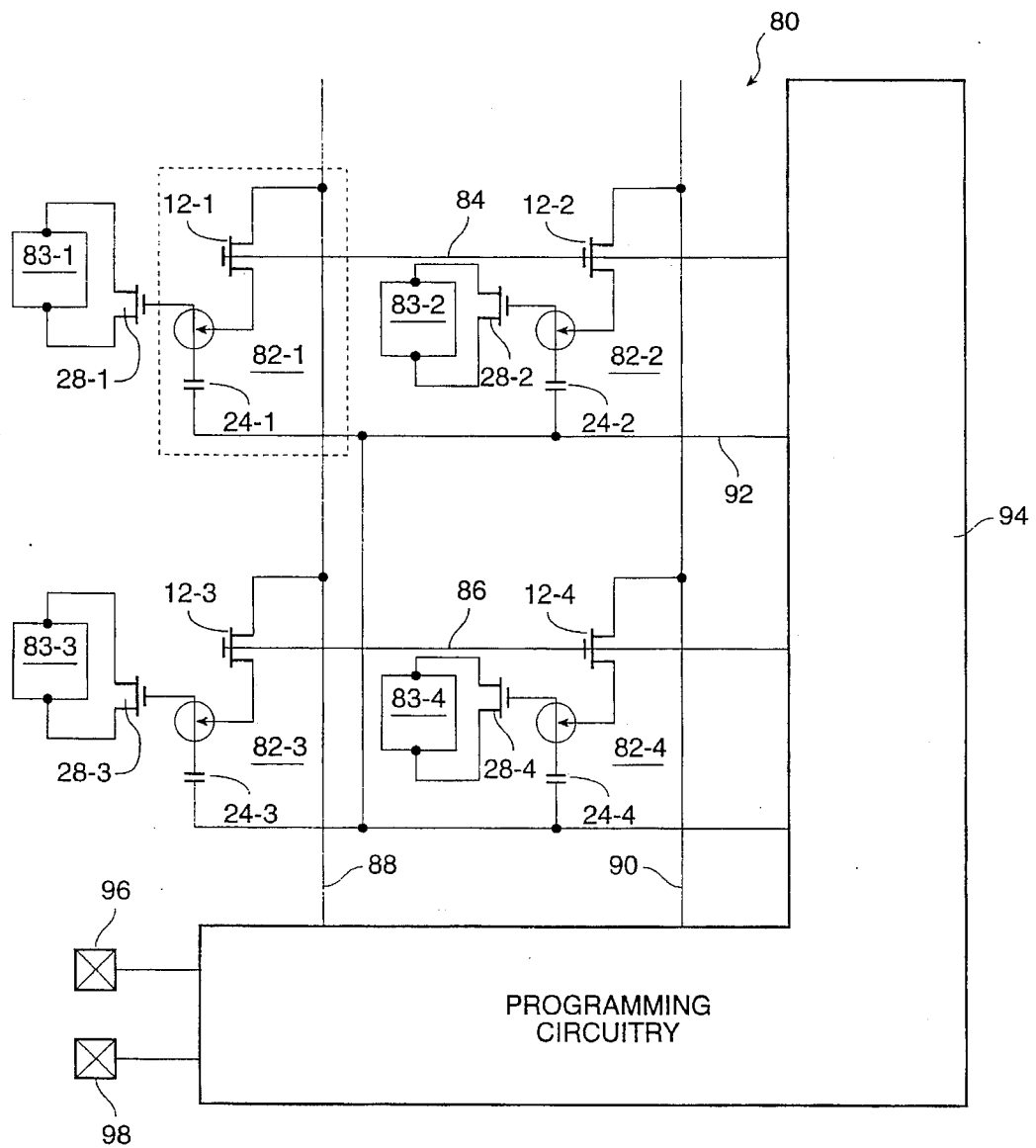
FIG. 4 is a schematic diagram of a two-by-two array of one-transistor, electrically-alterable switches according to another aspect of the present invention.

The one-transistor, electrically-alterable switch 10 of the present invention is particularly suitable for use in an array containing a plurality of such switches. One such application is a user-programmable integrated circuit such as an FPGA integrated circuit, where the pass transistors are used to make connections between interconnect conductors and for defining circuit functions. FIG. 4 is a schematic diagram of an illustrative two-by-two array 80 of one-transistor electrically-alterable switches 10 such as those of FIGS. 1–3.

The array 80 is arranged in rows and columns and the illustrative array of FIG. 4 includes two rows and two columns although those of ordinary skill in the art will recognize that arbitrarily large arrays 80 can be fabricated using the teachings of the present invention. The first row of array 80 includes one-transistor electrically-alterable switches 82-1 and 82-2 and the second row of array 80 includes one-transistor electrically-alterable switches 82-3 and 82-4. Likewise, the first column of array 80 includes one-transistor electrically-alterable switches 82-1 and 82-3 and the second column of array 80 includes one-transistor electrically-alterable switches 82-2 and 82-4.

Each row in the array 80 has associated with it a row line and each column in the array 80 has associated with it a column line. First row line 84 is associated with the first row in the array 80 and second row line 86 is associated with the second row in the array 80. Similarly, first column line 88 is associated with the first column in the array 80 and second column line 90 is associated with the second column in the array 80.

The gates 18 of all transistors 12 in each row of array 80 are connected to the row line for that row. Thus the gates 18 of the transistors 12-1 and 12-2 in one-transistor electrically-alterable switches 82-1 and 82-2 are connected to first row line 84 and the gates of the transistors 12-3 and 12-4 in one-transistor electrically-alterable switches 82-3 and 82-4 are connected to second row line 86.

The drains 14 of all transistors 12 in each column of array 80 are connected to the column line for that column. Thus the drains 14 of the transistors 12-1 and 12-3 in one-transistor electrically-alterable switches 82-1 and 82-3 are connected to first column line 88 and the drains 14 of the transistors 12-2 and 12-4 in one-transistor electrically-alterable switches 82-2 and 82-4 are connected to second column line 90. The erase electrodes 26 of all of the one-transistor electrically-alterable switches 12-1, 12-2, 12-3, and 12-4 at coupling capacitors 24-11, 24-2, 24-3, and 24-4 are connected to one another in common erase electrode 92.

Pass transistors 28-1 through 28-4 are shown with their sources 32 and drains 30 respectively connected to blocks 83-1, 83-2, 83-3, and 83-4, representative of user-programmable circuit paths defining the function of circuit elements and defining circuit paths within a user-programmable circuit. It will be understood by those of ordinary skill in the art that the selective connection paths afforded thereby may be employed in a large variety of ways by a user, including, but not limited to, use as user-programmable interconnect elements in devices such as FPGA architectures, defining functions of logic function modules by internally configuring their elements, etc.

First and second row lines 84 and 86, first and second column line 88 and 90, and common erase electrode 92 are connected to programming circuitry 94. The function of programming circuitry 94 is to provide the appropriate voltage potentials necessary to erase or selectively program the one-transistor, electrically alterable switches 82-1 through 82-4 in the array 80. Those of ordinary skill in the art will recognize that conventional circuitry may be used to configure programming circuitry 94 to route the appropriate voltages to first and second row lines 84 and 86, first and second column lines 88 and 90, and common erase electrode 82. As will also be understood by those of ordinary skill in the art, programming circuitry 94 may be controlled from off chip by means of signals applied to one or more I/O pads on the integrated circuit. Two illustrative I/O pads 96 and 98 for this purpose are shown in FIG. 4, but those skilled in the art will recognize that the number of I/O pads required for any actual embodiment of the present invention will depend upon the design of the programming circuitry 94.

In order to globally erase all of the one-transistor electrically-alterable switches 82-1 through 82-4 in array 80, programming circuitry 94 places the programming potential Vpp on common erase electrode 92, places ground potential on first and second column lines 88 and 90, and places Vpp on first and second row lines 84 and 86. As described previously for the individual one-transistor electrically alterable switches 82-1 through 82-4 of the present invention, this causes electrons to tunnel onto the floating gates 20 and results in turning off all pass transistors 28.

In order to selectively program any one-transistor, electrically-alterable switch in the array, its row line is brought to Vpp, its column line is brought to Vpp and the common erase electrode 92 is held at ground potential. The row lines and column lines of the remaining unselected one-transistor, electrically-alterable switches are held at ground potential. Under these conditions, electrons are tunneled off of only the floating gate 20 of the selected one-transistor, electrically-alterable switch.

As an example of selective programming of one-transistor, electrically-alterable 82-1 through 82-4 switches in the array 80 of the present invention, if it is desired to program one-transistor, electrically-alterable switch 72-1 in the array 80, first row line 84 and first column line 88 are brought to Vpp, second row line 86 and second column line 90 are held at ground potential, and the common erase electrode 92 is held at ground potential.

Figure 5:
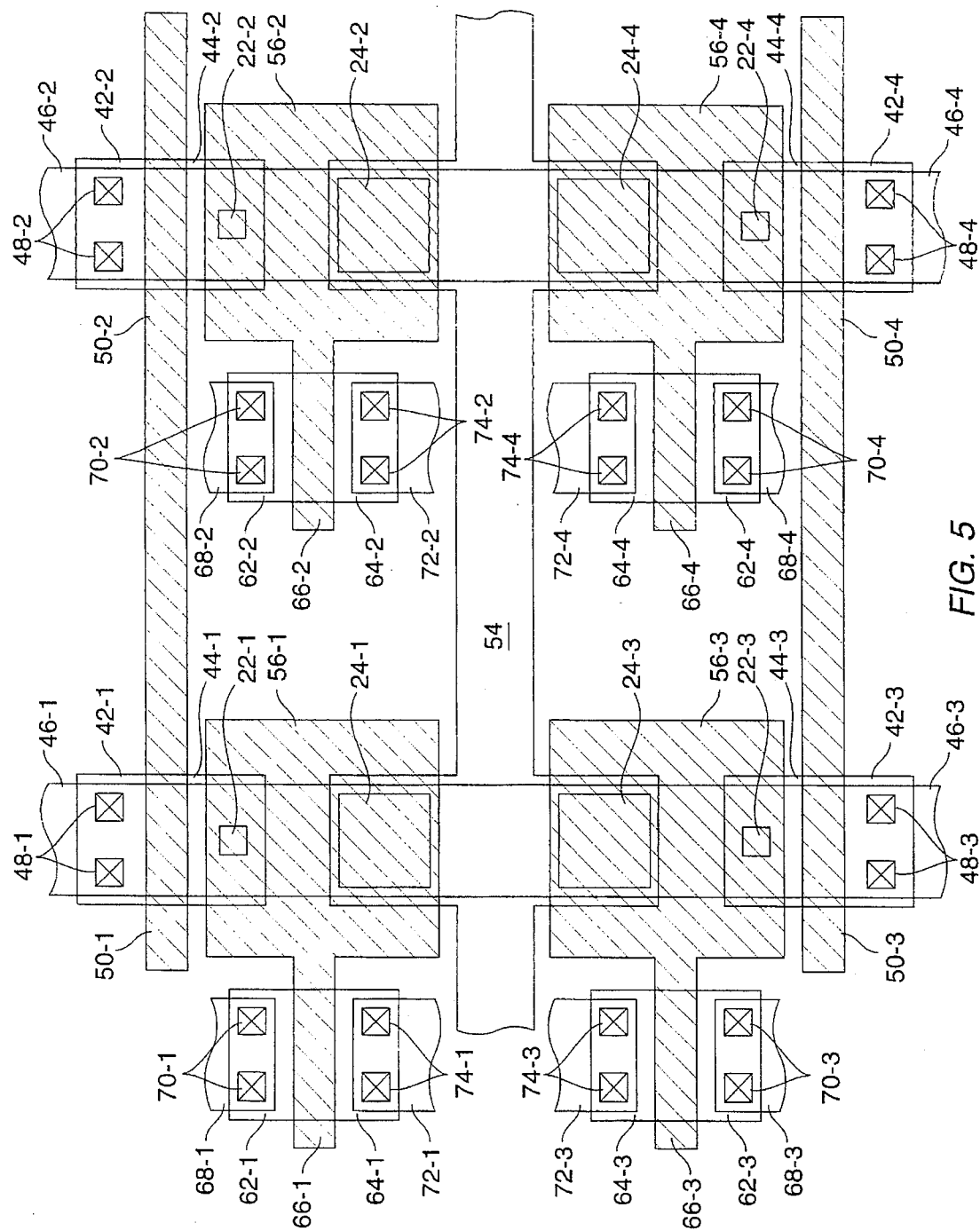
FIG. 5 is a top view of a presently preferred semiconductor layout of the array of one-transistor, electrically-alterable switches of FIG. 4.

The layout of FIGS. 2 and 3 readily lends itself to use in an array 80 such as that depicted in FIG. 4. FIG. 5 is a top view of a presently preferred semiconductor layout of such an array of one-transistor, electrically-alterable switches. Those of ordinary skill in the art will readily envision the cross sectional view as an obvious extension of FIG. 3 herein.

As will be appreciated by those of ordinary skill in the art, the layout of FIG. 5 has a step-and-repeat symmetry in the horizontal direction and a mirror-image symmetry in the vertical direction about an axis centered along the common erase electrode diffusion 92. The elements of FIG. 5 are given reference numerals corresponding to the reference numerals employed in FIG. 2, with the extensions -1, -2, -3, and -4 to correspond to the designations of array 90 positions depicted in FIG. 4. The first row line 84 is formed from a single polysilicon line, portions of which are lines 50-1 and 50-2, the gates 18 of the transistors 12-1 and 12-2 in one-transistor, electrically-alterable switches 82-1 and 82-2, and the second row line 76 is formed from a single polysilicon line, portions of which are lines 50-3 and 50-4, the gates 18 of the transistors 12-3 and 12-4 in one-transistor, electrically-alterable switches 82-3 and 82-4. The first column line 78 is formed from a single metal line, portions of which are metal lines 46-1 and 46-3 connected to one-transistor, electrically-alterable switches 82-1 and 82-3, and the second column line 80 is formed from a single metal line, portions of which are metal lines 46-2 and 46-4, connected to one-transistor, electrically-alterable switches 82-2 and 82-4. The programming circuitry 94 is not shown in FIG. 5, but as will be appreciated by those of ordinary skill in the art, programming circuitry 94 could be located elsewhere on the integrated circuit, such as at the periphery thereof.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A one-transistor, electrically-alterable switch in combination with a pass transistor, including:

a first MOS transistor having a drain, a gate, and a source;

a pass transistor having a drain, a source and a floating gate, said floating gate capacitively coupled to the source of said first MOS transistor through a tunneling dielectric, said drain and source of said pass transistor connected to user-programmable circuit paths in a user-programmable circuit;

an erase electrode capacitively coupled to said floating gate through a coupling dielectric; and wherein said user-programmable circuit paths provide one of the functions of defining the function of circuit elements and of defining circuit paths within said user-programmable circuit.

2. A one-transistor, electrically-alterable switch in combination with a pass transistor formed on a semiconductor substrate, including:

a pair of spaced-apart high-voltage switch transistor source and drain regions disposed in the semiconductor substrate and forming a switch transistor channel region therein;

a switch transistor gate formed from a first portion of a polysilicon layer, said switch transistor gate overlying said switch channel region and separated from said switch channel region by a gate oxide;

an erase electrode formed as a high-voltage diffused region in said substrate;

a floating gate comprising a second portion of said polysilicon layer separated from an upper surface of said semiconductor substrate by a gate oxide, said floating gate partially overlying said switch transistor source region, a portion of said floating gate overlying said switch transistor source region and separated therefrom by a tunneling dielectric having a first area, said floating gate also overlying said erase electrode and separated therefrom by a coupling dielectric having a second area larger than said first area;

a pair of spaced-apart pass transistor source and drain regions disposed in the semiconductor substrate and forming a pass transistor channel region therein, said spaced-apart pass transistor source and drain regions connected to user-programmable circuit paths in a user-programmable circuit;

a pass transistor gate formed from said first polysilicon layer, said pass transistor gate overlying said pass channel region and separated from said pass channel region by a gate oxide, said pass transistor gate electrically connected to said floating gate; and wherein said user-programmable circuit paths provide one of the functions of defining the function of circuit elements and of defining circuit paths within said user-programmable circuit.

3. An array of rows and columns of one-transistor, electrically-alterable switches including:

a row line associated with each row of said array;

a column line associated with each column of said array;

a plurality of one-transistor, electrically-alterable switches, each of said switches including a first MOS transistor having a drain connected to the one of said column lines associated with its column, a gate connected to the one of said row lines associated with its row, a source, and a floating gate capacitively coupled to said source by a tunneling capacitor;

a plurality of pass transistors, each pass transistor associated with one of said one-transistor, electrically-alterable switches and having a drain, a source and a gate, said gate electrically connected to the floating gate of the one of said one-transistor, electrically-alterable switches with which it is associated;

a common erase electrode capacitively coupled to said floating gates of each of said pass transistors by a coupling capacitor; and programming circuitry, said programming circuitry connected to each said row line, each said column line, and said common erase electrode line for selectively driving each said row line to ground or to a programming voltage, for selectively driving each said column line to ground or to said programming voltage, and for selectively driving said common erase electrode to ground or to said programming voltage, to program and erase said electrically-alterable switches in said array.

* * * * *

UNITED STATES PATENT AND TRADEMARK OFFICE
CERTIFICATE OF CORRECTION

PATENT NO. : Vikram Kowshik
DATED : 5,576,568
INVENTOR(S) : November 19, 1996

It is certified that error appears in the above-indentified patent and that said Letters Patent is hereby corrected as shown below:

---In Col. 4, line 16, replace "switch" with --switch 10--.

---In Col. 5, line 53, replace "EEPROM and EEPROM" with --EEPROM and EPROM--.

---In Col. 5, line 62, replace "army 80" with --array 80--.

---In Col. 6, line 33, replace "24-11" with --24-1--.

---In Col. 6, lines 57-58, replace "common erase electrode 82" with --common erase electrode 92--.

---In Col. 7, line 20, replace "switch 72" with --switch 82--.

---In Col. 7, line 40, replace "array 90" with --array 80--.

---In Col. 7, line 45, replace "second row line 76" with --second row line 86--.

---In Col. 7, lines 48-49, replace "first column line 78" with --first column line 88--.

---In Col. 7, line 52, replace "second column line 80" with --second column line 90--.

Signed and Sealed this

Twenty-seventh Day of May, 1997

BRUCE LEHMAN

*Attest:*

*Attesting Officer*       *Commissioner of Patents and Trademarks*